United States Patent
Nagasawa et al.

(10) Patent No.: US 7,101,774 B2
(45) Date of Patent: Sep. 5, 2006

(54) METHOD OF MANUFACTURING COMPOUND SINGLE CRYSTAL

(75) Inventors: Hiroyuki Nagasawa, Hachiouji (JP); Kuniaki Yagi, Ome (JP); Takamitsu Kawahara, Kawasaki (JP)

(73) Assignee: Hoya Corporation, Tokyo (JP)

( * ) Notice: Subject to any disclaimer, the term of this patent is extended or adjusted under 35 U.S.C. 154(b) by 255 days.

(21) Appl. No.: 10/227,336

(22) Filed: Aug. 26, 2002

(65) Prior Publication Data

US 2003/0045102 A1 Mar. 6, 2003

(30) Foreign Application Priority Data

Aug. 27, 2001 (JP) .................................... 2001-256295

(51) Int. Cl.
*H01L 21/20* (2006.01)
*C30B 25/18* (2006.01)

(52) U.S. Cl. ..................................... 438/478; 438/604

(58) Field of Classification Search ................ 438/604, 438/478, 503, 974
See application file for complete search history.

(56) References Cited

U.S. PATENT DOCUMENTS 6,051,849 A * 4/2000 Davis et al. ................. 257/103
6,225,650 B1 * 5/2001 Tadatomo et al. ........... 257/190
6,252,261 B1 * 6/2001 Usui et al. ................... 257/190
6,265,289 B1 * 7/2001 Zheleva et al. .............. 438/478
6,294,440 B1 * 9/2001 Tsuda et al. ................. 438/479
6,500,747 B1 * 12/2002 Lee et al. .................... 438/604

FOREIGN PATENT DOCUMENTS

EP 000495787 B1 * 2/1994
EP 001288346 A2 * 3/2003

* cited by examiner

*Primary Examiner*—Carl Whitehead, Jr.
*Assistant Examiner*—David S. Blum
(74) *Attorney, Agent, or Firm*—Oblon, Spivak, McClelland, Maier & Neustadt, P.C.

(57) ABSTRACT

Provided is a method of manufacturing compound single crystals by epitaxially growing a compound single crystal layer differing from the substrate in which the planar defects generated in the crystal that is epitaxially grown are reduced. The method of manufacturing compound single crystals in which a compound single crystalline layer differing from a compound single crystalline substrate is epitaxially grown on the surface of said substrate. Plural undulations extending in a single direction are present on at least a portion of the surface of said substrate, and in that said undulations are provided in such a manner that as said compound single crystalline layer grows, the defects that grow meet each other.

7 Claims, 2 Drawing Sheets

METHOD OF MANUFACTURING COMPOUND SINGLE CRYSTAL

TECHNICAL FIELD

The present invention relates to a method of manufacturing compound single crystals that are useful as electronic materials. The present invention relates to a method of manufacturing compound single crystals that are desirable from the aspect of improving the yield and characteristics of semiconductor devices during the manufacturing thereof, that have a low defect density, and that present little crystal lattice deformation.

BACKGROUND OF THE INVENTION

Conventionally, substrates employed in semiconductor devices have been cut into platelike ingots of compound semiconductor crystal, for example, processed into specific external shapes, surface ground, and employed as semiconductor wafers. Further, in the course of manufacturing high-performance semiconductor devices, films with few crystal defects and low impurity concentrations have been epitaxially grown on compound semiconductor substrates obtained by processing these ingots.

There are times when it is difficult to manufacture compound semiconductors as ingots, and it is sometimes technically difficult or expensive to obtain large surface area ingots. In such cases, comparatively readily obtainable semiconductor wafers such as Si substrates are sometimes employed with a means (heteroepitaxy) of forming an epitaxial layer of a desired compound semiconductor crystal on the wafer.

However, heteroepitaxy produces nonconformity in the lattice constants of the substrate crystal and the layer of crystal grown over it. Thus, crystal defects caused by this nonconformity are generated at the boundary of the substrate crystal and the layer of crystal grown over it. In compound semiconductor crystals, in particular, a greater variety of crystal defects is generated than in crystals comprised of a single element, such as planar defects (antiphase boundaries) generated at the boundary between regions in which the stacking order of constituent elements is reversed, and defects of partial crystal rotation (twins). Since such crystal defects cause a decrease in breakdown voltage and an increase in leak currents in the manufacture of semiconductor devices, they must be suppressed as much as possible. However, since planar defects of low surface energy preferentially grow during the growth of compound single crystals, such crystal defects are difficult to eliminate.

For example, when heteroepitaxially growing silicon carbide (SiC) on a Si substrate, planar defects (antiphase boundaries and twins) are generated in the SiC film. A method of reducing these planar defects has been proposed that consists of the steps of providing growth regions on a growth substrate and growing silicon carbide single crystal on these growth regions to a thickness greater than or equal to the natural thickness of the substrate in the orientation of the growth plane (Japanese Examined Patent Publication (KOKOKU) Hei 6-41400). However, the two antiphase regions contained in the SiC are characterized by expanding in mutually perpendicular orientations as the SiC increases in film thickness. Thus, it has not been possible to effectively reduce antiphase boundaries even with continued heteroepitaxial growth.

One means of eliminating crystal lattice nonconformity is to insert another layer (buffer layer) having a lattice constant falling between that of the substrate and the layer grown over it. However, for example, in cases where SiC is being grown on an Si substrate, there is no known substance that is suitable as a buffer layer. As a result, lattice constant nonconformity of 20 percent results when directly growing SiC on a Si substrate, becoming the principal cause of planar defects in the epitaxially grown layer of SiC.

In such methods of epitaxial growth on single crystalline substrates, an increase in stacking defect density due to differences in the lattice constants of the substrate material and silicon carbide often becomes a problem. In particular, since the silicon that is generally employed as the growth substrate has a high degree of lattice nonconformity with silicon carbide, numerous twins and antiphase boundaries (APBs) are generated in the silicon carbide growth layer. These become one of the principal causes of leak currents and the like, compromising the characteristics of silicon carbide electronic elements.

K. Shibahara et al. have proposed a method of growth on a silicon (001) surface substrate in which the surface normal axis is slightly tilted (in which an off angle is introduced) from the <001> direction in the <110> direction as a method of effectively reducing antiphase boundaries (Applied Physics Letter, Vol. 50, 1987, p. 1,888). In this method, antiphase boundaries generated at silicon substrate surface terraces are eliminated at the points where antiphase boundaries meet, but antiphase boundaries generated at single atom steps in the silicon substrate do not meet one another and are not eliminated.

As a method of reducing such planar defects (twins, APBs) in silicon carbide, the present inventors have proposed the technique of eliminating planar defects propagating within silicon carbide by imparting undulations extending in a direction parallel to the silicon substrate surface and epitaxially growing silicon carbide on a substrate that has been processed with such undulations (Japanese Patent Application (TOKUGAN) No. 2000-365443 and Japanese Unexamined Patent Publication (KOKAI) No. 2000-178740). This method yields silicon carbide in which planar defects are greatly reduced.

Further, compound semiconductors such as gallium nitride are expected to serve as blue LEDs and power device materials. There have been numerous reports and examples of the growth of gallium nitride on silicon carbide substrates in recent years. This is because the use of silicon carbide as a base substrate in the growth of gallium nitride affords such advantages as facilitating the formation of electrodes, permitting ready heat dissipation, and facilitating handling and processing due to an identical crystal cleavage direction. However, there are problems in that there are few high-quality silicon carbide substrates with large surface areas, and planar defects end up propagating in the gallium nitride growth layer due to boundary lattice nonconformity. Just as when growing silicon carbide on a silicon substrate, it is necessary to examine measures for eliminating defects.

To eliminate crystal defects occurring at high density with heterogeneous substrates in the crystal growth of gallium nitride (GaN), it has been proposed that a layer blocking the growth of GaN be provided during the growth process and the fact that selectively grown GaN grows horizontally above openings provided in portions of the growth inhibiting layer be exploited to reduce vertically propagating crystal defects (U.S. Pat. No. 6,051,849). However, in this method, the steps of forming a GaN growth-blocking layer and the fashioning of holes therein become necessary, increasing the cost of manufacturing. Further, since the GaN above the openings has the property of propagating with the crystal defects within it remaining intact, crystal defects are not completely eliminated.

Accordingly, the object of the present invention is to provide a method of manufacturing compound single crystals by epitaxially growing a compound single crystal layer differing from the substrate in which the planar defects generated in the crystal that is epitaxially grown are reduced.

SUMMARY OF THE INVENTION

The present invention, which solves the above-stated problems, is as follows:

(1) A method of manufacturing compound single crystals in which a compound single crystalline layer differing from a compound single crystalline substrate is epitaxially grown on the surface of said substrate, characterized in that plural undulations extending in a single direction are present on at least a portion of the surface of said substrate, and in that said undulations are provided in such a manner that as said compound single crystalline layer grows, the defects that grow meet each other.

(2) The method of manufacturing according to (1) wherein said plural undulations are wavy or serrated in shape in a cross-section perpendicular to the direction of extension of said undulations.

(3) The method of manufacturing according to (1) or (2) wherein said compound single crystal constituting said compound single crystalline layer and said compound single crystal constituting said compound single crystalline substrate have similar space lattices.

(4) The method of manufacturing according to (1) or (2) wherein said compound single crystalline substrate is single crystalline SiC.

(5) The method of manufacturing according to (4) wherein said compound single crystalline layer is gallium nitride, aluminum nitride, indium gallium nitride, or aluminum gallium nitride.

(6) The method of manufacturing according to (4) or (5) wherein said single crystalline SiC substrate is cubic SiC and the basal plane is the (001) face, or is hexagonal SiC and the basal plane is the (11-20) face or the (1100) face.

MODES OF IMPLEMENTING THE INVENTION

In the method of manufacturing compound single crystals of the present invention, a compound single crystalline layer differing from a compound single crystalline substrate is epitaxially grown on the surface of the substrate. This manufacturing method is characterized in that plural undulations extending in a single direction are present on at least a portion of the surface of said substrate, and in that said undulations are provided in such a manner that as said compound single crystalline layer epitaxially grows, the defects that grow meet each other.

The compound constituting the compound single crystalline substrate employed in the manufacturing method of the present invention may be, for example, a group IV—IV compound, group III–V compound, or group II–VI compound. Specific examples are compounds (semiconductors) such as SiC, GaAs, AlAs, InAs, GaP, GaSb, InP, InSb, ZnS, ZnSe, CdS, CdTe, and HgTe. Sapphire is an example of a compound constituting the compound single crystalline substrate. However, the compound constituting the compound single crystalline substrate may be a crystal of any space lattice, examples of which are cubic and hexagonal structures.

More specific examples of the single crystalline substrate are cubic SiC substrates having a (001) basal plane and hexagonal SiC substrates having a (11-20) or (1100) basal plane.

Further, the compound single crystal that is epitaxially grown by the manufacturing method of the present invention may be suitably selected from among the compounds given above as examples of compounds constituting the compound single crystalline substrate. More specific examples of the compound single crystalline layers are gallium nitride, aluminum nitride, indium gallium nitride, and aluminum gallium nitride.

The method of manufacturing compound single crystals of the present invention, in which a compound single crystalline layer differing from a compound single crystalline substrate is epitaxially grown, is particularly effective when the compound single crystal constituting the compound single crystalline layer and the compound single crystal constituting the compound single crystalline substrate have similar space lattices.

The statement that the two single crystals have similar space lattices means that the positional relations between the atoms of the structural units of the crystals (base unit structures) are similar, the bonding orientation between atoms is identical, and they grow in the same crystal axis orientation (epitaxial growth).

Further, examples of two single crystals having similar space lattices are cubic GaN/cubic SiC, hexagonal GaN/hexagonal SiC, hexagonal AlN/hexagonal SiC, hexagonal AlGaN/hexagonal SiC, cubic AlN/cubic SiC, and hexagonal (4H) SiC/hexagonal (6H) SiC.

Figure 1:
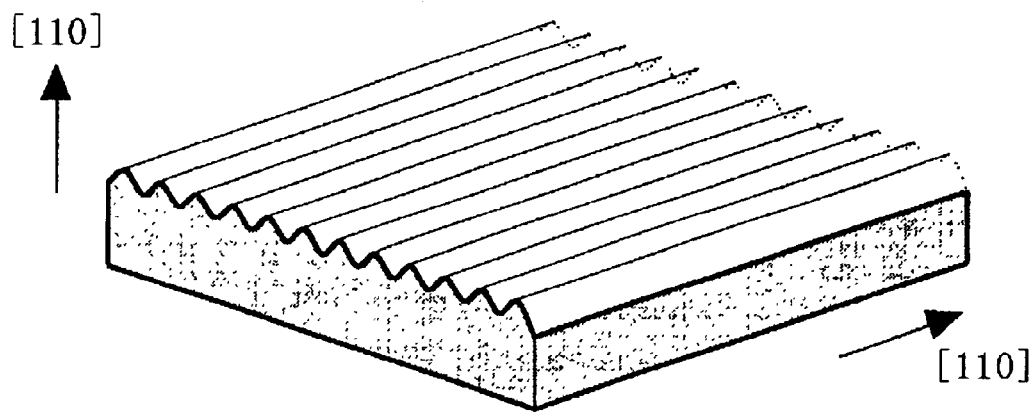
FIG. 1 shows an example of a substrate having plural undulations that are wavy in cross-sectional shape.

The substrate employed in the manufacturing method of the present invention comprises plural undulations extending in a single direction on at least part of the surface thereof. Plural undulations are provided on at least a portion of the substrate surface, but are desirably provided on the entire surface on which epitaxial growth is conducted. Further, the undulations are provided in such a manner that defects growing with epitaxial growth of the compound single crystalline layer meet each other. More specifically, the plural undulations have wavy or serrated cross-sectional shapes perpendicular to the direction of extension of the undulations. FIG. 1 shows an example of plural undulations having a wavy cross-section.

The wavy shape of the undulations will be described in greater detail.

Figure 2:
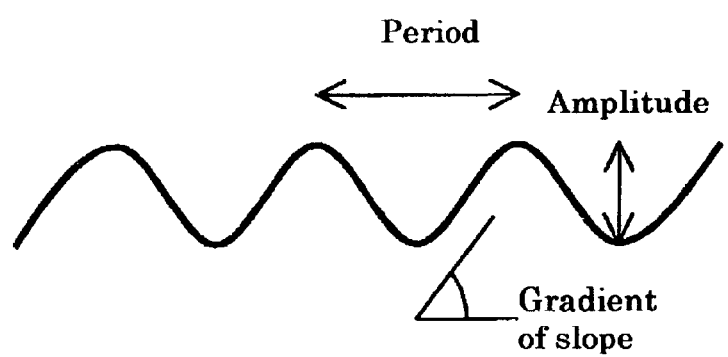
FIG. 2 is a descriptive drawing of the distance between peaks, the period, and the amplitude of undulations that are wavy in cross-sectional shape.

The cross-sectional shape of the plural undulations provided on the substrate surface is wavy. As shown in FIG. 1, all of the waves extend in a single direction. The inclined surfaces of adjacent undulation peaks are opposed, and this state is continuous. The distance from peak to peak of the undulations is referred to as the period, and the difference in height between peaks and valleys is referred to as the amplitude (see FIG. 2). Further, the angle formed by the inclined surface running from peak to valley relative to the average line of the substrate surface is referred to as the gradient of slope. The length of the period ranges from about 0.01 micrometer to 1 mm, preferably from 0.1 micrometer to 10 micrometers.

The magnitude of amplitude is from 1 nm to 50 micrometers, preferably from 10 to 100 nm. For cubic crystals, the gradient of slope is from 0.1° to 54.7° (for example, an angle smaller than the angle formed by the (001) face and the (111) face), preferably from 1 to 6°. The undulations may extend in any direction to achieve the effect of eliminating planar defects, but desirably extend in a direction parallel to the <110> orientation to effectively eliminate planer defects of {111} faces.

In hexagonal crystals, the gradient of slope may be an angle (the angle varies with the crystal lattice constant) smaller than the angle formed by {1-101} relative to the (0001) growth face, for example. Further, it may be an angle less than or equal to the angle formed by the C axis (0001) with the (01-10) M face or the (1-102) R face.

The surface having undulations may be obtained by processing by grinding (grinding in which rubbing is limited to a single direction), for example. Although some variation in the individual shape of undulations results from variation in the type and striking method of the grinding wheel or abrasive, conditions can be optimized to achieve undulations with shapes roughly corresponding to those set forth above.

Figure 3:
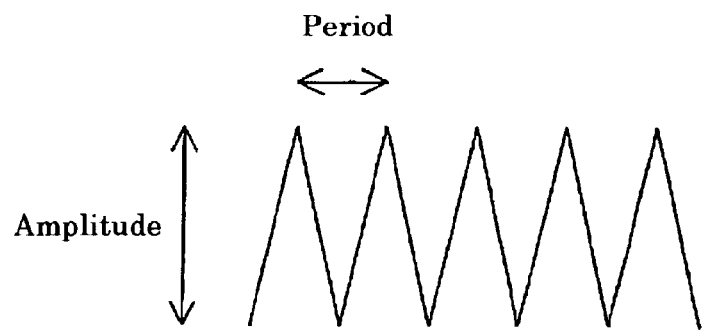
FIG. 3 is a descriptive drawing of the distance between peaks, the period, and the amplitude of undulations that are serrated in cross-sectional shape.

In contrast to wavy undulations, serrated undulations have sharply angled peaks and valleys (see FIG. 3). The distance from undulation peak to peak is referred to as the period and the difference in height between peaks and valleys is referred to as the amplitude. Further, the angle formed by the inclined surface running from peak to valley relative to the average line of the substrate surface is referred to as the gradient of slope. The length of the period ranges from about 0.01 micrometer to 1 mm, preferably from 0.1 micrometer to 10 micrometers. The magnitude of amplitude is from 1 nm to 50 micrometers, preferably from 10 to 100 nm. For cubic crystals, the gradient of slope is from 0.1° to 54.7° (for example, an angle smaller than the angle formed by the (001) face and the (111) face), preferably from 1 to 6°. The undulations may extend in any direction to achieve the effect of eliminating planar defects, but desirably extend in a direction parallel to the <110> orientation to effectively eliminate planer defects of {111} faces. The individual undulations are formed so that inclined surfaces having gradients smaller than 90° with the basal plane are opposed, and are desirably shaped so that when the inclination of the surface relative to the basal plane is integrated over the entire surface, the value obtained is essentially 0°.

Compound single crystalline substrates with the above-mentioned undulations having wavy or serrated cross-sections perpendicular to the direction in which the undulations extend may be produced, for example, by photolithographic techniques, press processing techniques, laser processing and ultrasound processing techniques, and processing by grinding. No matter which method is employed, it suffices for the final form of the growth substrate surface and single crystalline layer to permit defects growing during epitaxial growth to meet.

When employing photolithographic techniques, it is possible to transfer any shape of undulation to the growth substrate by forming a desired mask pattern transferred on the substrate. For example, the line width of the pattern can be changed to control the width of the undulation shape. The selected etching rates of the resist and the substrate can be controlled to regulate the depth of the undulation pattern and angle of the inclined surface. When forming a substrate on which the undulations of the substrate surface have a wavy or serrated cross-section perpendicular to the direction of extension of the undulations, after transferring a pattern to the resist, the resist can be softened by heat treatment to form an undulation pattern of curved (wavy) cross section.

When employing press processing techniques, the press mold can be shaped to yield any desired shape of undulation on the growth substrate. Molds of various shape can be formed to form various shapes of undulation on the growth substrate.

When employing laser processing or ultrasound processing techniques, minute processing is possible because the undulation shape is directly formed on the substrate.

When employing processing by grinding, the abrasive particle size employed in grinding and the processing pressure can be varied to control the width and depth of the undulation shape. When manufacturing a substrate or single crystalline layer with an undulation shape in a single direction, grinding is conducted in just a single direction.

When employing dry etching, the etching conditions and shape of the etching mask can be changed to control the width and depth of the undulation shape. When forming a substrate in which the undulations on the substrate surface have a wavy or serrated cross-section perpendicular to the direction of extension of the undulations, the etching mask can be positioned away from the substrate on which patterns are transferred to transfer wavy or serrated patterns due to the etching being diffused between the mask and the substrate. Further, a mask having a window cross-section of pedestal shape widening toward the substrate on which patterns are transferred may also be employed.

In the manufacturing method of the present invention, a compound single crystal is epitaxially grown on the surface of the above-described substrate. Methods of epitaxially growing compound single crystals that are suitable for use include chemical vapor deposition (CVD), liquid phase epitaxy, sputtering, and molecular beam epitaxy (MBE).

Figure 4:
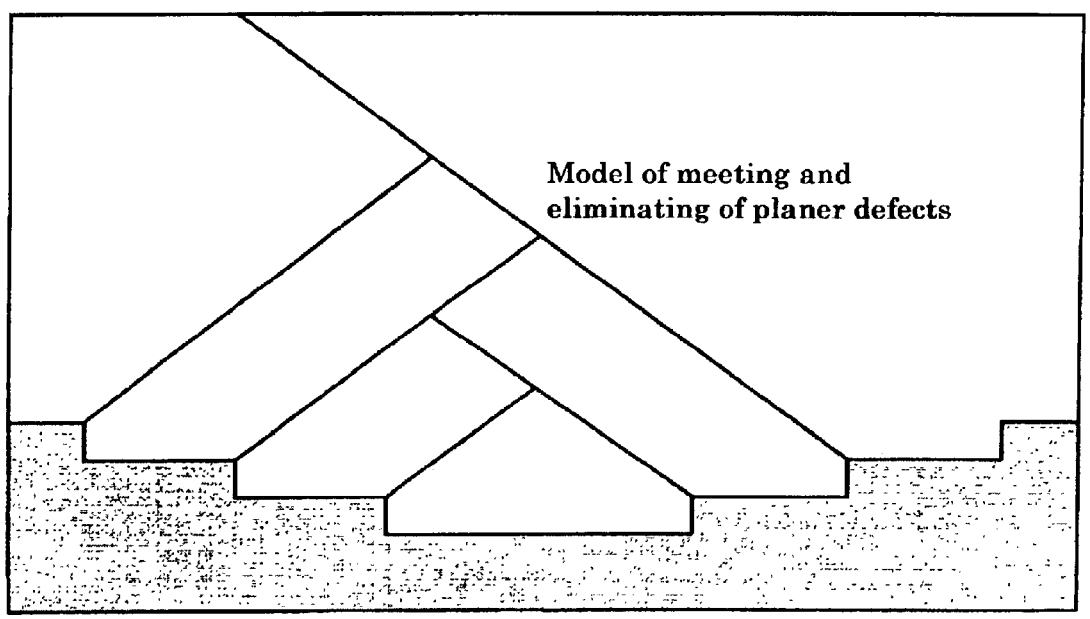
FIG. 4 is a descriptive drawing showing how planar defects propagating in a compound single crystal are eliminated (opposing planar defects meet each other and cancel out) in a method of epitaxially growing a compound single crystal on a substrate that has been processed to impart undulations and on which off-inclined surfaces are mutually opposed.

More specifically, a Ga source (for example, trimethylgallium) and a N source (for example, ammonia) are simultaneously fed and GaN is grown on a substrate in the form of the substrate set forth above using a MOCVD equipment. When growing AlGaN, an Al source (for example, trimethylaluminum) is further supplied. Providing undulations on the substrate makes it possible to position off-inclined surfaces opposite each other on the substrate as shown in FIG. 4 so that opposing planar defects meet each other and are eliminated.

EXAMPLES

The present invention is further described below through examples.

Example 1

Undulations were imparted to 3C-SiC and gallium nitride (GaN) was formed thereon.

The processing of undulations on the 3C-SiC surface was conducted in the following manner.

Diamond compound 60 micrometers in diameter was coated on M414 cloth made by Engis Co. and SiC was rubbed in a single direction over the cloth. The pressure applied in this process was 0.1 kg/cm$^2$. The undulation-processed substrate obtained was treated by thermal oxidation (1,100° C., 5 hours, $O_2$ atmosphere) and the oxide film was removed with diluted HF.

Trimethylgallium and ammonia were supplied with an organic metal chemical vapor deposition (MOCVD) equipment to the 3C-SiC substrate surface obtained to form GaN. The growth temperature was 1,100° C., 20 slm of nitrogen as carrier gas, 10 slm of ammonia ($NH_3$) and $1\times10^{-4}$ mol/min of trimethylgallium were fed. The film thickness was about 10 micrometers.

The twin density in the resultant GaN was obtained from an X-ray diffraction peak pole figure in the manner set forth below.

A GaN (111) face diffraction pole figure was prepared with the GaN (001) face as pole and the twin density was calculated from the ratio of the signal intensity in the orientation of {115} faces corresponding to twin planes to the signal intensity in the orientation of {111} faces of a normal single crystalline surface. The result revealed the twin density to be less than or equal to the measurement limit of $4\times10^{-4}$ Vol. %.

Comparative Example 1

GaN was formed on 3C-SiC that had not been undulation processed. The same method of formation was employed as in Example 1. The twin density of the GaN obtained was calculated in the following manner. A GaN (111) face diffraction pole figure was prepared with the GaN (001) face as pole and the twin density was calculated from the ratio of the signal intensity in the orientation of {115} faces corresponding to twin planes to the signal intensity in the orientation of {111} faces of a normal single crystalline surface. The result revealed the twin density to be $5\times10^{-3}$ Vol. %.

Example 2

The surface of a 3C-SiC substrate 200 micrometers in thickness obtained by CVD was processed to impart undulation. Abrasive was rubbed in parallel to the <110> direction on the surface of a SiC (001) substrate six inches in diameter to prepare a substrate having undulations parallel to the <110> direction. The abrasives employed were commercially available about 15 micrometer diameter diamond slurry (Hipress made by Engis Co.) and commercially available abrasive cloth (Engis M414). The cloth was impregnated with diamond slurry uniformly, the Si (001) substrate was placed on the pad, a pressure of 0.2 kg/cm$^2$ was applied over the entire SiC (001) substrate, and [the substrate] was run about 300 times back and forth over the cloth over a distance of about 20 cm parallel to the <110> direction (single direction grinding processing). Countless abrasive striations (undulations) were formed on the SiC (001) substrate surface parallel to the <110> direction.

Because grinding abrasive and the like had adhered to the surface of the SiC (001) substrate during the single direction grinding treatment, it was cleaned with an ultrasound cleaning system and then washed with a mixed solution of hydrogen peroxide aqueous solution and sulfuric acid (1:1), and with an HF solution. After washing, a heat treatment furnace was employed to form a thermal oxidation film of about 0.1 micrometer on the undulation-processed substrate under the conditions shown in the table. The thermal oxidation film formed was removed with diluted hydrofluoric acid. Large numbers of irregularities on fine spikes and defects were present on the substrate surface in addition to the desired undulations and it was difficult to employ the substrate used for growth. However, a thermal oxidation film of about 0.1 micrometer was formed and the oxide film was then removed to etch the substrate surface by about 200 Angstroms, removing the minute irregularities and yielding extremely smooth undulations. A look at the wavy cross-section revealed the wavy irregularities to be irregular and unstable in size, but high in density. They were always in a continuously undulating state. The depth of the channels was 30 to 50 nm and the width thereof was 1 to 2 micrometers. The gradient of slope was 3 to 5°.

TABLE 1

| | |
|---|---|
| Equipment | Atmospheric pressure heat treatment furnace (hot wall type) |
| Temperature | 1,000 to 1,200° C. |
| Oxygen flow rate | 1 to 5 slm (100 to 1,000 sccm steam) |
| Diluting gas (argon) flow rate | 1 to 5 slm |
| Processing time | 3 hours |

Aluminum nitride (AlN) was formed on the above 3C-SiC. An organic metal chemical vapor deposition (MOCVD) equipment was employed to feed trimethylaluminum and ammonia, and AlN was formed. The growth temperature was 1,100° C., 20 slm of nitrogen as carrier gas, 10 slm of ammonia ($NH_3$) and $1\times10^{-4}$ mol/min of trimethylaluminum were fed. The film thickness was made about 10 micrometers.

The twin density of the AlN was obtained as follows.

An AlN (111) face diffraction pole figure with the AlN (001) face as pole was prepared and the twin density was calculated from the ratio of the signal intensity in the orientation of {115} faces corresponding to twin planes to the signal intensity in the orientation of {111} faces of a normal single crystalline surface. The results revealed the twin density to be less than or equal to the measurement limit of $4\times10^{-4}$ Vol. %.

Comparative Example 2

AlN was formed on 3C-SiC that had not been undulation processed as a comparative example. The method of formation was identical to that employed in Example 2. The twin density of the AlN obtained was obtained in the following manner. An AlN (111) face diffraction pole figure with the AlN (001) face as pole was prepared and the twin density was calculated from the ratio of the signal intensity in the orientation of {115} faces corresponding to twin planes to the signal intensity in the orientation of {111} faces of a normal single crystalline surface. The results revealed the twin density to be $7\times10^{-3}$ Vol. %.

The present invention provides a method of manufacturing compound single crystals by epitaxially growing a compound single crystalline layer differing from the substrate, permitting a reduction in the planar defects generated within crystal that is epitaxially grown.

The present disclosure relates to the subject matter contained in Japanese Patent Application No. 2001-256295 filed on Aug. 27, 2001, which is expressly incorporated herein by reference in its entirety.

What is claimed is:

1. A method of manufacturing compound single crystals in which a compound single crystalline layer differing from a compound single crystalline substrate is epitaxially grown on the surface of said compound single crystalline substrate, comprising providing plural undulations extending in a single direction on at least a portion of the surface of said compound single crystalline substrate, wherein said plural undulations are provided such that as said compound single crystalline layer grows, defects that grow meet each other.

2. The method of manufacturing according to claim 1, wherein said plural undulations are wavy or serrated in shape in a cross-section perpendicular to the single direction in which said plural undulations extend.

3. The method of manufacturing according to claim 1 or 2, wherein said compound single crystal constituting said compound single crystalline layer and said compound single crystal constituting said compound single crystalline substrate have similar space lattices.

4. The method of manufacturing according to claim 1 or 2, wherein said compound single crystalline substrate is single crystalline SiC.

5. The method of manufacturing according to claim 4, wherein said compound single crystalline layer is gallium nitride, aluminum nitride, indium gallium nitride, or aluminum gallium nitride.

6. The method of manufacturing according to claim 4, wherein said single crystalline SiC substrate is cubic SiC and the basal plane is the (001) face, or is hexagonal SiC and the basal plane is the (11-20) face or the (1-100) face.

7. The method of manufacturing according to claim 5, wherein said single crystalline SiC substrate is cubic SiC and the basal plane is the (001) face, or is hexagonal SiC and the basal plane is the (11-20) face or the (1-100) face.

* * * * *